United States Patent [19]
Araki et al.

[11] Patent Number: 5,805,603
[45] Date of Patent: Sep. 8, 1998

[54] SYNCHRONOUS SEMICONDUCTOR MEMORY DEVICE REALIZING HIGH SPEED AND ACCURATE OPERATION

[75] Inventors: Takashi Araki; Yasuhiro Konishi; Hisashi Iwamoto, all of Hyogo, Japan

[73] Assignee: Mitsubishi Denki Kabushiki Kaisha, Tokyo, Japan

[21] Appl. No.: 779,068

[22] Filed: Jan. 7, 1997

[30] Foreign Application Priority Data

Jul. 5, 1996 [JP] Japan .................................. 8-176591

[51] Int. Cl.$^6$ .......................................................... G11C 8/00
[52] U.S. Cl. ................................................. 371/1; 395/552
[58] Field of Search ............................ 371/1, 21.1, 25.1, 371/22.36, 27.7, 42, 47.1, 62; 395/298, 183.18, 551–553, 555–560; 324/765; 365/233, 201, 194, 189.05, 189.08; 326/96, 93

[56] References Cited

U.S. PATENT DOCUMENTS 5,444,667  8/1995  Obara ....................................... 365/233
5,454,116  9/1995  Harigai et al. ............................ 395/800
5,535,171  7/1996  Kim et al. ................................ 365/233
5,581,512  12/1996  Kitamura ................................. 365/233
5,623,453  4/1997  Shinozaki ................................ 365/233
5,627,794  5/1997  Lee ......................................... 365/233

FOREIGN PATENT DOCUMENTS 6-311012  11/1994  Japan .
7-86916   3/1995  Japan .
7-141860  6/1995  Japan .

*Primary Examiner*—Robert W. Beausoliel, Jr.
*Assistant Examiner*—Nadeem Iqbal
*Attorney, Agent, or Firm*—Lowe, Price, LeBlanc & Becker

[57] ABSTRACT

A synchronous semiconductor memory device is provided with a delay circuit between an input latch circuit and a pad. The synchronous semiconductor memory device can operate at a higher speed since respective external input signals supplied to a plurality of pads are delayed such that the time required for transmission from respective pads to the input latch circuit is equal, and that skew is eliminated.

5 Claims, 14 Drawing Sheets

SYNCHRONOUS SEMICONDUCTOR MEMORY DEVICE REALIZING HIGH SPEED AND ACCURATE OPERATION

BACKGROUND OF THE INVENTION

1. Field of the Invention

The present invention relates to a semiconductor memory device, and more particularly, to a synchronous semiconductor memory device which operates in synchronization with a clock signal.

2. Description of the Background Art

Although a Dynamic Random Access Memory (DRAM) used as a main memory operates at a speed higher than before, the operating speed is still lower than that of the Microprocessor Unit (MPU). The access time and cycle time of DRAM thus deteriorate the performance of the entire system. Therefore, as a main memory for a high speed MPU, a synchronous DRAM (hereinafter referred to as "SDRAM" or "synchronous semiconductor memory device") which operates in synchronization with a clock signal has been proposed.

In order to realize a high speed access in an SDRAM, a specification of high speed access to consecutive bits, for example, consecutive eight bits (per one data input/output terminal), in synchronization with system clock signal is proposed.

FIG. 15 is a timing chart showing a normal operation of an SDRAM in which the consecutive access described above is performed. In the SDRAM which allows input/output of eight-bit data (byte data) at data input/output terminals DQ0 to DQ7, eight-bit data (total 8×8=64 bits) are consecutively written or read.

As shown in FIG. 15, in the SDRAM, at a rising edge of an externally supplied clock-signal CLK shown at (a) of FIG. 15 which is a system clock, external control signals, i.e., a chip select signal /CS, a row address strobe signal /RAS, a column address strobe signal /CAS, an address signal Add. and the like respectively shown at (b), (c), (d) and (f) of FIG. 15 are received. Address signal Add. shown at (f) of FIG. 15 is supplied as a row address signal X and a column address signal Y according to the time division multiplex system. At a rising edge of clock signal CLK shown at (a) of FIG. 15, if chip select signal /CS at (b) of FIG. 15 and row address strobe signal /RAS at (c) of FIG. 15 are at "L" level of an active state, and column address strobe signal /CAS at (d) of FIG. 15 and a write enable signal /WE at (e) of FIG. 15 are at "H" level, address signal Add. is received as a row address signal Xa as shown at (f) of FIG. 15.

On the other hand, at a rising edge of clock signal CLK, if chip select signal /CS and column address strobe signal /CAS are at "L" level of an active state, address signal Add. is received as a column address Yb as shown at (f) of FIG. 15.

In accordance with the received row address signal Xa and column address signal Yb, corresponding row and column are selected in the SDRAM. As shown at (h) of FIG. 15, initial eight-bit data Q is output after a CAS latency (3 clock cycles in this example). Data is thereafter output in response to the rise of clock signal CLK. The number of bits read out consecutively is referred to as a burst length, and FIG. 15 shows a burst length of eight.

In writing operation, a row address signal Xc is received in the same manner as the reading of data. A column address signal Yd is received when chip select signal /CS and column address strobe signal /CAS, as well as write enable signal /WE are at L level of an active state at a rising edge of clock signal CLK, and a data d0 which is supplied at this time enters as an initial write data. Row and column are thus selected in response to the falling of row address strobe signal /RAS and column address strobe signal /CAS in SDRAM. Input data are sequentially supplied from d1 to d7 in synchronization with clock signal CLK, and the input data are sequentially written in a memory cell.

Different from a conventional DRAM in which an address signal, input data and the like are received in synchronization with external control signals of row address strobe signal /RAS and column address strobe signal /CAS, in the SDRAM, external signals such as row address strobe signal /RAS, column address strobe signal /CAS, address signal Add. and input data are received at a rising edge of externally supplied clock signal CLK which is a system clock.

The SDRAM further utilizes a conception of "multiple banks". According to the multiple banks system, internal memory arrays are divided into a plurality of portions, then activation of a bank by activating a word line and operating a sense amplifier as well as precharge can be performed almost separately, bank by bank.

The precharge is necessary before the access operation in the DRAM, making the cycle time twice as long as the access time.

If there are internal multiple banks, for example, access operation in a first bank and precharge of a second bank can simultaneously be proceeded, thereby realizing access operation in the second bank with no precharge time. The time wasted on the precharge can thus be eliminated by alternately performing the access and the precharge for the first and the second banks. This procedure is comparable to the externally performed interleave, introduced into the DRAM.

As for the SDRAM, as described above, external signals such as row address strobe signal /RAS, column address strobe signal /CAS, address signal Add. and input data are received at the rising edge of externally supplied clock signal CLK.

FIG. 16 illustrates a layout of a structure of a conventional synchronous semiconductor memory device.

As shown in FIG. 16, an external clock signal ext.CLK supplied to an external clock pad 2 is buffered in a clock buffer 4, then an internal clock signal int.CLK is generated. Internal clock signal int.CLK triggers buffering of external input signals in input buffers 12, 22 and 34, then internal input signals are generated and latched in an input latch circuit 8.

External input signals ext.A, ext.B and ext.C must be buffered in order to be used as internal signals. As shown in FIG. 16, input buffers 12, 22, and 34 for externally receiving respective external input signals ext.A, ext.B, and ext.C are accordingly placed adjacent to corresponding pads. Input latch circuit 8 is further provided at the central portion of the chip adjacent to clock buffer 4 so as to minimize the delay generated when internal clock signal int.CLK is transmitted to input latch circuit 8.

However, in the circuit layout shown in FIG. 16, even if the delay of internal clock signal int.CLK supplied to input latch circuit 8 is decreased, there arises another problem of delay caused by parasitic resistance and parasitic capacitance in the interconnection from each of input buffers 12, 22, and 34 located adjacent to the pads to input latch circuit 8 (hereinafter simply referred to as "interconnection delay").

FIG. 17 is a timing chart for describing this delay problem. FIG. 17 shows timing relation of signals externally supplied to the conventional synchronous semiconductor memory device shown in FIG. 16.

At the rising edge (time T) of external clock signal ext.CLK shown at FIG. 17(*a*), external signals ext.A, ext.B, and ext.C shown at (b), (c), and (d) of FIG. 17 are entered. Here, set up time denotes the maximum time in which the external signals are supplied to an corresponding input pad in advance to take data accurately at time T, and hold time denotes the maximum time in which the external signals are continuously supplied to an corresponding input pad in order to take data accurately at time T.

Relations among the distances from respective pads receiving respective external input signals to input latch circuit 8 are shown in FIG. 16. External input signals ext.A, ext.B, and ext.C are input and buffered at corresponding input buffers 12, 22, and 34, then internal input signals int.A, int.B, and int.C are generated and input to input latch circuit 8. At this time, difference of interconnection delay causes skew, so that internal input signals are sequentially input to input latch circuit 8 from int.C, int.B, and int.A. These internal input signals int.A, int.B and int.C are latched at input latch circuit 8 at a rising edge of input clock signal int.CLK generated by buffering external clock signal ext-.CLK at clock buffer 4.

Therefore, there are differences in the set up time and hold time due to the skew among internal input signals int.A, int.B, and int.C.

As shown in (b) and (d) of FIG. 17, set up time depends on external input signal ext.A having the maximum interconnection delay, and hold time depends on external input signal ext.C having the minimum interconnection delay. The width of the window defined by the sum of set up time and hold time increases, so that the SDRAM is hindered from operating at a higher speed.

The problem in the conventional SDRAM is, therefore, that the width of the window is increased due to the skew among internal input signals int.A, int.B, and int.C caused by the difference of the interconnection delay, when input latch circuit 8 is placed at the center of the chip adjacent to clock buffer 4 so as to minimize the delay of internal clock signal int.CLK due to the interconnection.

SUMMARY OF THE INVENTION

An object of the present invention is to provide a synchronous semiconductor memory device operating at a high speed by eliminating skew among signals.

According to one aspect of the present invention, a synchronous semiconductor memory device operating in synchronization with a clock signal includes:

a clock buffer buffering an externally supplied external clock signal to generate an internal clock signal; a latch circuit connected to the clock buffer, responsive to the internal clock signal for latching an internal signal; a plurality of input buffers connected to the latch circuit by interconnections having mutually different lengths, buffering externally supplied external signals to generate internal signals; and a delay circuit. The delay circuit is connected between at least one of the plurality of input buffers and the latch circuit, and delays an internal signal such that the internal signal is transmitted from any input buffer of the plurality of input buffers to the latch circuit taking the same period of time.

According to another aspect of the present invention, a synchronous semiconductor memory device operating in synchronization with a clock signal includes: an internal clock signal generating circuit responsive to an externally supplied external clock signal for generating an internal clock signal; a plurality of output buffers connected to the internal clock signal generating circuit by interconnections having mutually different lengths, responsive to the internal clock signal for outputting data; and a delay circuit. The delay circuit is connected between at least one of the plurality of output buffers and the internal clock signal generating circuit, and delays an internal clock signal such that the internal clock signal generated at the internal clock signal generating circuit is simultaneously transmitted to the plurality of output buffers.

According to still another aspect of the invention, a synchronous semiconductor memory device operating in synchronization with a clock signal is provided with: a clock buffer buffering an externally supplied external clock signal to generate an internal clock signal; an input buffer buffering an externally supplied control signal or an address signal to generate a corresponding internal control signal; a data buffer buffering externally supplied data; a latch circuit located adjacent to the clock buffer, responsive to the internal clock signal for latching the control signal, the address signal, or the data buffered at the data buffer; and a delay circuit. The delay circuit is connected between the data buffer and the latch circuit, and delays the data buffered at the data buffer for a time period longer than the delay time caused while the internal control signal is transmitted from the input buffer to the latch circuit.

An advantage of the present invention is, therefore, that a higher and more accurate operation can be realized in a synchronous semiconductor memory device.

Another advantage of the present invention is that a higher and more accurate operation can be realized in a synchronous semiconductor memory device even if the semiconductor memory device is used as a module.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
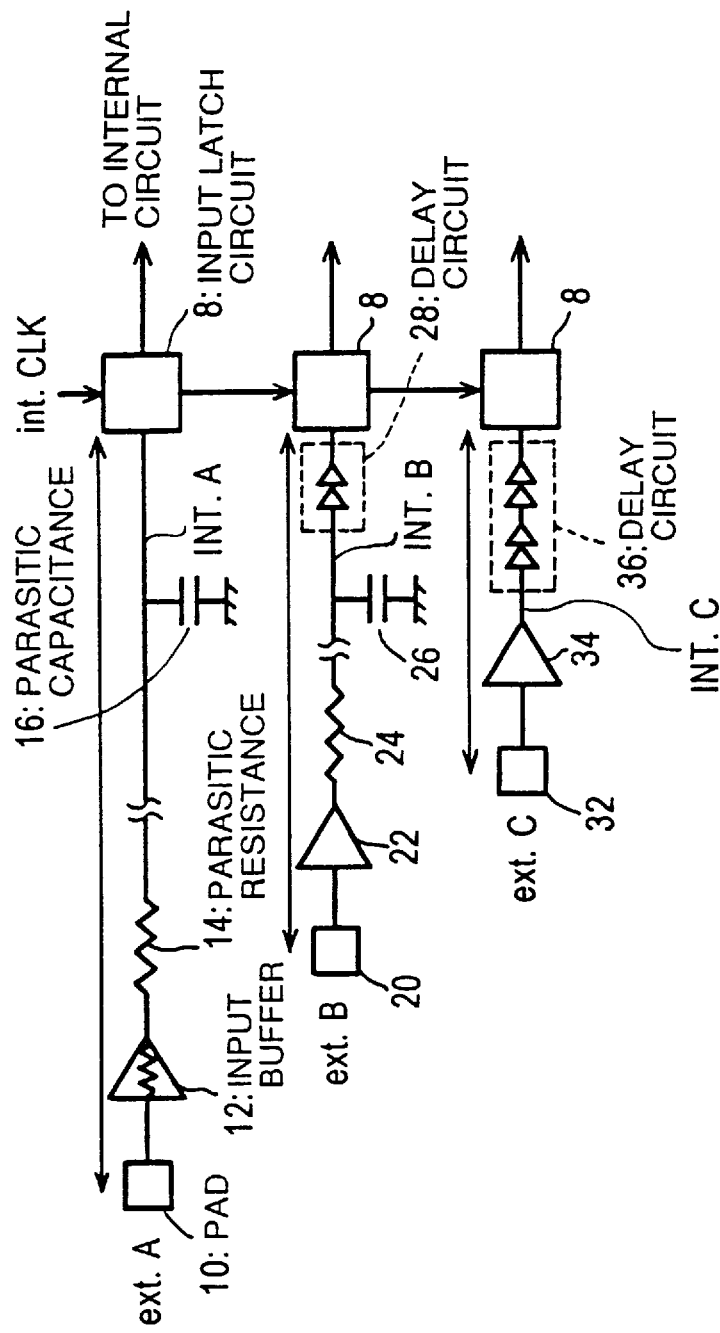
FIG. 1 illustrates a structure of a synchronous semiconductor memory device according to the first embodiment of the invention.

Preferred embodiments of the present invention are hereinafter described in detail, referring to the drawings. It is noted that identical reference characters represent identical or corresponding parts.

[First Embodiment]

FIG. 1 shows a structure of a synchronous semiconductor memory device according to the first embodiment of the invention.

As shown in FIG. 1, the synchronous semiconductor memory device is provided with pads 10, 20, and 32 receiving external input signals ext.A, ext.B, and ext.C; input buffers 12, 22, and 34 for respectively buffering external input signals ext.A, ext.B, and ext.C and for outputting internal input signals int.A, int.B and int.C; parasitic resistances 14 and 24; parasitic capacitances 16 and 26; input latch circuit 8; a delay circuit 28 connected between input buffer 22 and input latch circuit 8, and a delay circuit 36 connected between input buffer 34 and input latch circuit 8.

Since external input signal ext.A is input to pad 10 having the longest interconnection to input latch circuit 8, signal ext.A has larger parasitic resistance 14 and parasitic capacitance 16 due to the interconnection compared to external signals ext.B and ext.C. The delay in the transmission from pad 10 to input latch circuit 8 thus becomes large, causing skew among internal clock signals int.A, int.B and int.C. The present invention is therefore aimed at eliminating the skew among internal input signals int.A, int.B and int.C by adjusting the delay of all internal input signals int.A, int.B and int.C to the longest interconnection delay.

Specifically, as for external input signals ext.B and ext.C, delay circuits 28 and 36 are inserted according to the amount of parasitic resistances 14 and 24 as well as parasitic capacitances 16 and 26, thereby adjusting respective delays to the delay in external input signal ext.A having the largest interconnection delay. For example, delay circuit 28 is inserted for external input signal ext.B having interconnection delay smaller than that of external signal ext.A, and delay circuit 36 having its delay time longer than that of delay circuit 28 is inserted for external input signal ext.C having the minimum interconnection delay.

The skew among external input signals ext.A, ext.B and ext.C is eliminated, making shorter the hold time.

Figure 2:
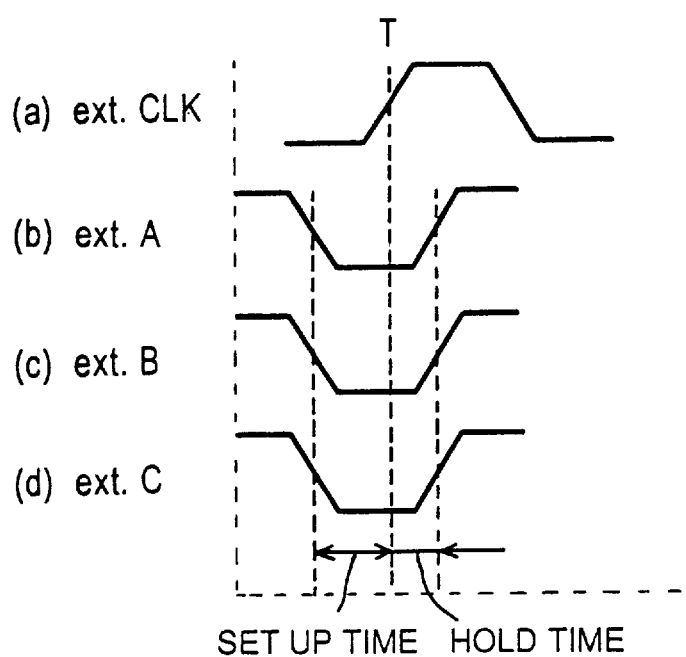
FIG. 2 is a timing chart showing the operation of the synchronous semiconductor memory device shown in FIG. 1.

FIG. 2 is a timing chart showing an operation of the synchronous semiconductor memory device according to the first embodiment. FIG. 2 shows the timing of externally supplied signals.

As shown at (b), (c), and (d) of FIG. 2, owing to the provision of such delay circuits 28 and 36, the skew among the externally supplied external input signals can be eliminated and the width of the window constituted by the set up time and the hold time can be decreased. As a result, higher frequency of external clock signal ext.CLK shown at (a) of FIG. 2 can be realized, thereby accelerating the operating speed of the synchronous semiconductor memory device.

The decreased width of the window can also ensure the sufficient time margin for receiving data for any of externally supplied external signals ext.A, ext.B, and ext.C, so that the synchronous semiconductor memory device can operate more accurately.

[Second Embodiment]

Figure 3:
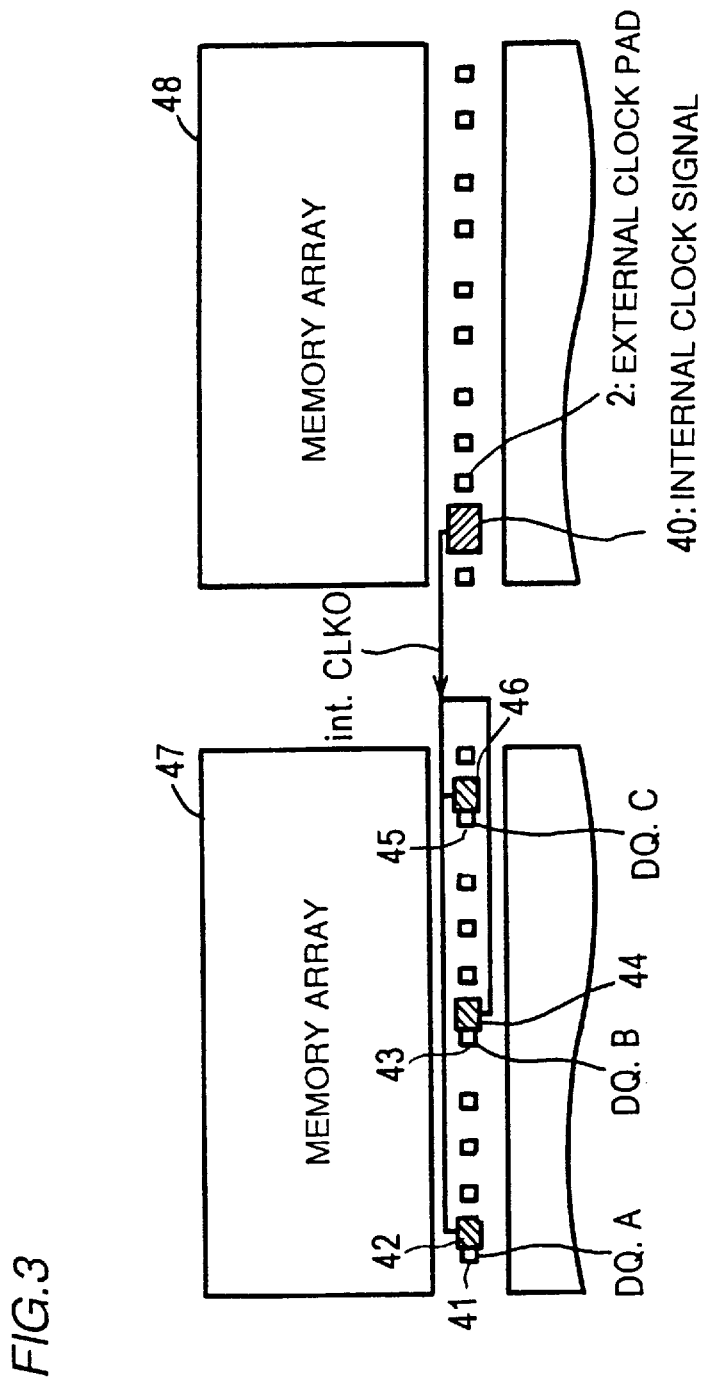
FIG. 3 shows a layout of a synchronous semiconductor memory device according to the second embodiment of the invention.
Figure 5:
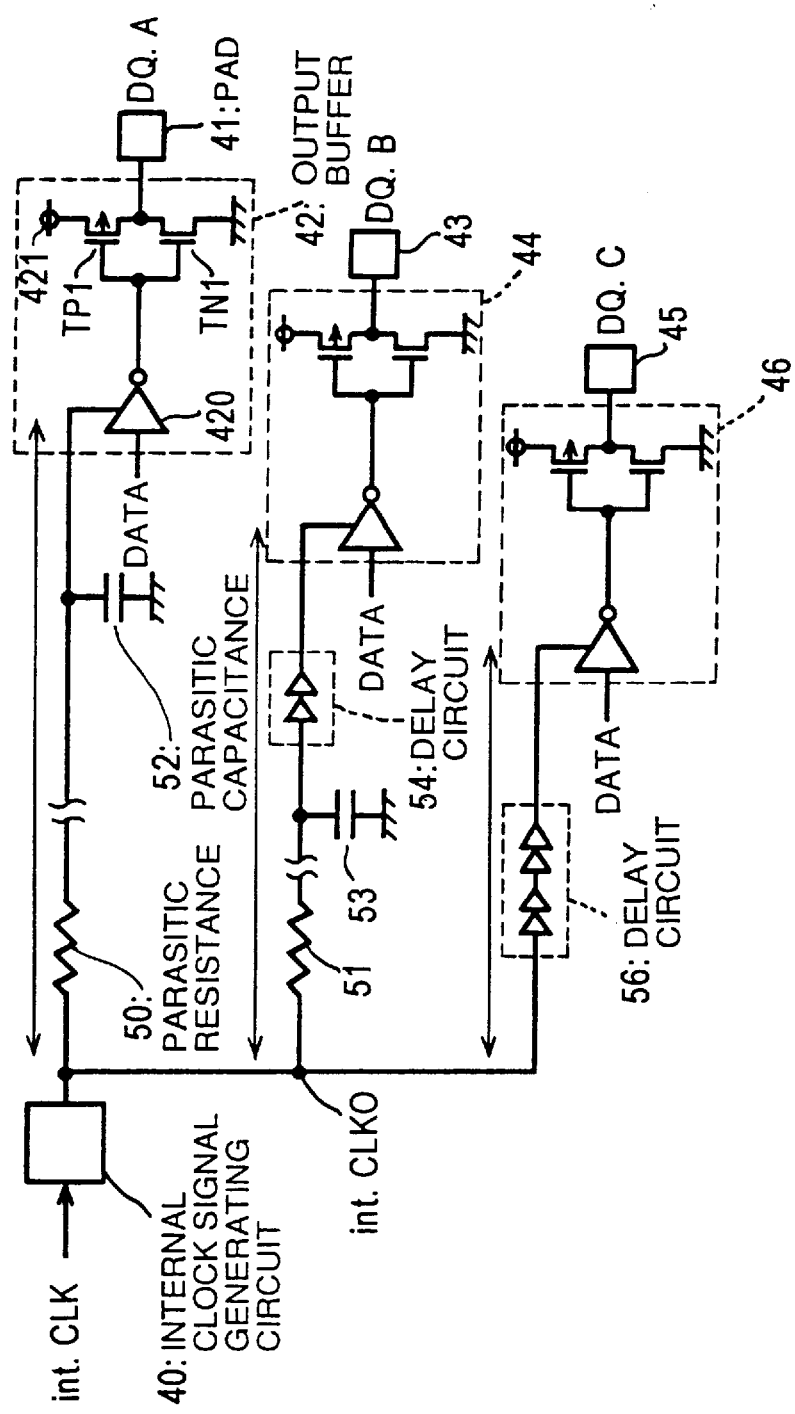
FIG. 5 specifically shows the structure of the synchronous semiconductor memory device shown in FIG. 3.

FIG. 5 illustrates a structure of a synchronous semiconductor memory device according to the second embodiment, and FIG. 3 shows the layout of the circuit shown in FIG. 5.

In SDRAM, external clock signal ext.CLK also triggers the output of data. Specifically, an internal clock signal int.CLKO used for output, generated from external clock signal ext.CLK, transfers internal data to output buffers 42, 44 and 46 and the data are output from pads 41, 43 and 45. As shown in FIG. 3, similar to input buffers 12, 22, and 34, output buffers 42, 44 and 46 are respectively placed adjacent to corresponding pads in order to decrease the delay of data due to interconnection resistance and interconnection capacitance, as well as to decrease the attenuation of data.

Since internal clock signal int.CLKO for output is generated based on internal clock signal int.CLK, an internal clock signal (int.CLKO) generating circuit 40 is arranged next to the buffer circuit for the input of external clock signal ext.CLK in order to decrease the interconnection delay of internal clock signal int.CLK. In such a circuit layout, even if the interconnection delay of internal clock signal int.CLK supplied to internal clock signal (int.CLKO) generating circuit 40 is decreased, interconnections from internal clock signal (int.CLKO) generating circuit 40 to respective output buffers 42, 44 and 46 located adjacent to respective pads 41, 43 and 45 cause undesirable parasitic resistance and parasitic capacitance, so that the skew in output data due to the variation of internal clock signal int.CLKO increases.

Figure 4:
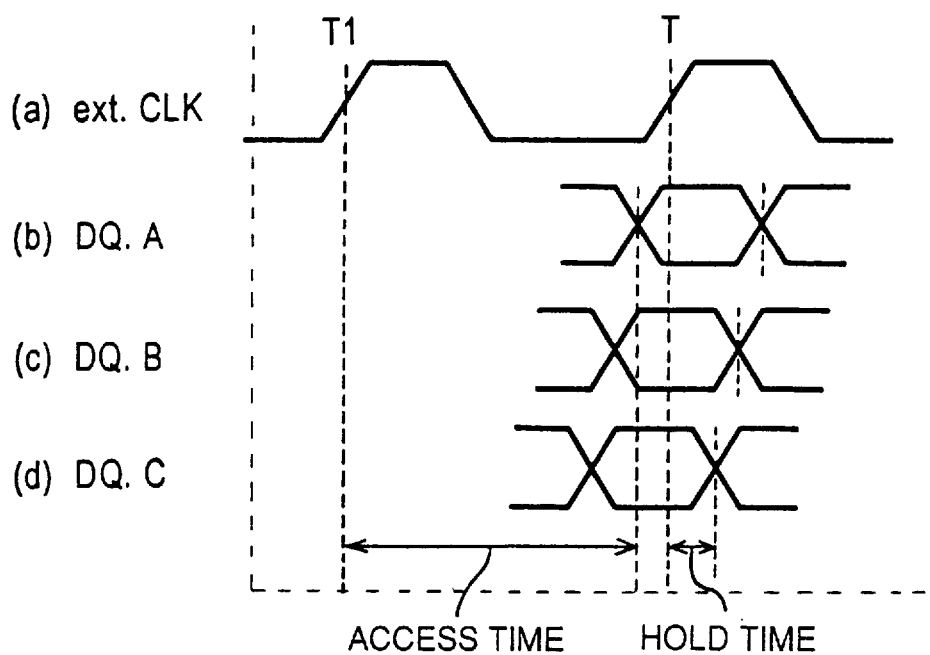
FIG. 4 is a timing chart showing the skew of output data in the synchronous semiconductor memory device shown in FIG. 3.

FIG. 4 is a timing chart showing the increased skew of output data due to interconnection delay. The skew among data DQ.A, DQ.B and DQ.C, produced when data is output in response to the rising (time T1) of external clock signal ext.CLK shown at (a) of FIG. 4, is considered.

The distance relations from internal clock signal (int.CLKO) generating circuit 40 to respective pads 41, 43 and 45 are shown in FIG. 3. Output data DQ.A, DQ.B and DQ.C are passed to the initial stages of respective output buffers 42, 44 and 46, and the data are output at the rising edge of internal clock signal (int.CLKO). At this time, because of the skew caused due to the difference of interconnection delay in internal clock signal int.CLKO, data DQ.C, data DQ.B, data DQ.A are output in this order from corresponding pads 45, 43 and 41 sequentially. Therefore, data DQ.A, DQ.B and DQ.C accordingly have different access time and hold time. As shown in FIG. 4, when data DQ.A, DQ.B, and DQ.C are received by external circuits at the time of T, access time (time from the rising of external clock signal ext.CLK for outputting data to the output of desired data) is dependent on data DQ.A having the maximum interconnection delay, and hold time of the data is dependent on data DQ.C having the minimum interconnection delay. Therefore, in the system which incorporates SDRAM, the width of the window of set up/hold time of the data input to CPU receiving output data of SDRAM is decreased and the skew is large, so that the cycle of the system clock cannot be made short, then higher speed operation of the system becomes impossible. The circuit shown in FIG. 5 is therefore employed. As shown in FIG. 5, the distance of the interconnection from internal clock signal (int.CLKO) generating circuit 40 to output buffer 42 is the largest for data DQ.A, so that parasitic resistance and parasitic capacitance due to the interconnection of internal clock signal int.CLKO, as well as the delay time are larger compared with those for other data DQ.B and DQ.C. Output of data DQ.A is thus delayed, and skew is produced among output data DQ.A, DQ.B and DQ.C. In this embodiment, the skew among respective output data DQ.A, DQ.B and DQ.C is eliminated by adjusting the delay of internal clock signal int.CLKO supplied to respective output buffers 42, 44 and 46 to the maximum interconnection delay. In other words, delay circuits 54 and 56 are inserted for data DQ.B and DQ.C according to the amount of parasitic resistances 50 and 51 and parasitic capacitances 52 and 53 in internal clock signal int.CLKO, thereby adjusting each delay to be the same as the maximum interconnection delay in internal clock signal int.CLKO for data DQ.A.

For example, delay circuit 54 is inserted between internal clock signal generating circuit 40 and output buffer 44 for internal clock signal int.CLKO used for data DQ.B having interconnection delay smaller than that of internal clock signal int.CLKO for data DQ.A, and delay circuit 56 having delay time longer than that of delay circuit 54 is inserted between internal clock signal generating circuit 40 and output buffer 46 for internal clock signal int.CLKO used for data DQ.C having the shortest interconnection delay.

Figure 6:
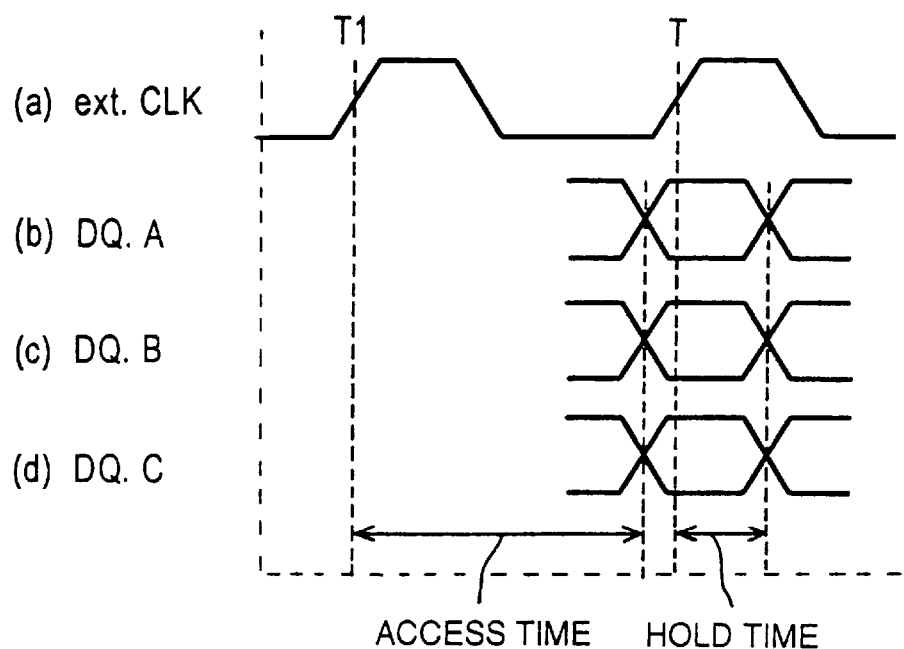
FIG. 6 is a timing chart showing the operation of the synchronous semiconductor memory device in FIG. 5.

FIG. 6 is a timing chart showing the operation of the synchronous semiconductor memory device having such a structure.

As shown in FIG. 6, the skew among output data DQ.A, DQ.B and DQ.C is eliminated because there is no skew in internal clock signals int.CLKO supplied to the initial stages of output buffers 42, 44 and 46.

In the system incorporating SDRAM according to the second embodiment, the width of the window of set up/hold time of data input to CPU receiving output data from SDRAM can be increased, and the system can operate at a higher speed and more accurately as in the first embodiment.

[Third Embodiment]

Figure 7:
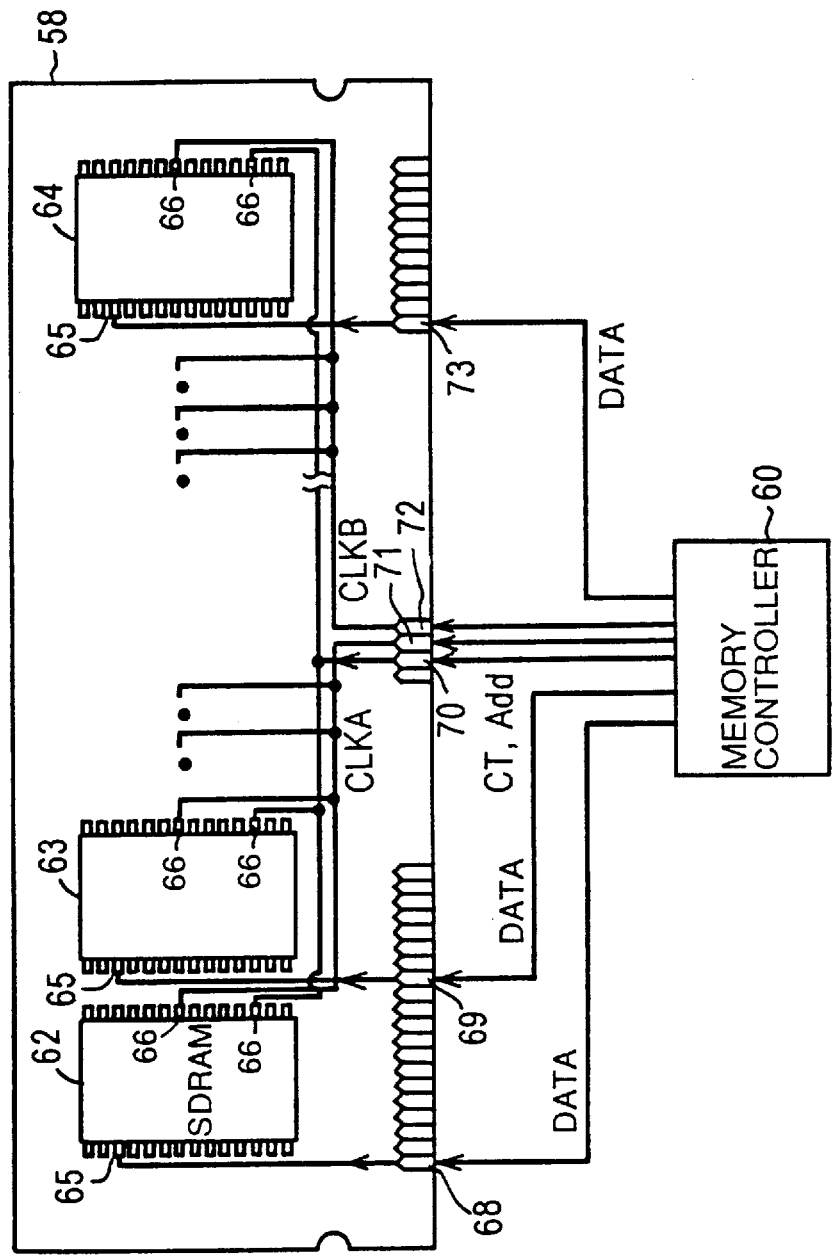
FIG. 7 shows a structure of a DIMM employing a synchronous semiconductor memory device according to the third embodiment of the invention.
Figure 12:
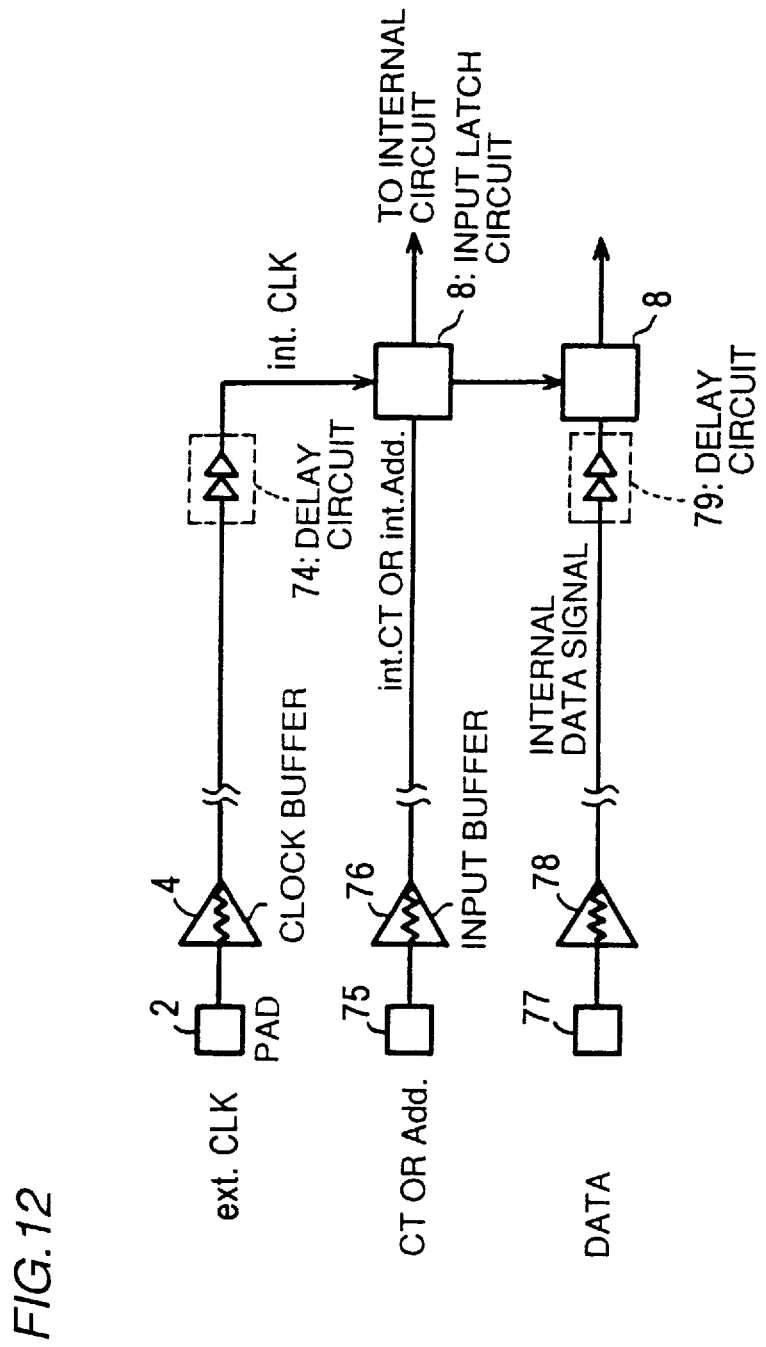
FIG. 12 illustrates a structure of the synchronous semiconductor memory device according to the third embodiment of the invention.

FIG. 12 shows a structure of a synchronous semiconductor memory device according to the third embodiment, and FIG. 7 shows a structure of a memory module employing the synchronous semiconductor memory device shown in FIG. 12 (Dual Inline Memory Module, hereinafter referred to as "DIMM").

A memory such as DRAM is usually incorporated in a system as a memory module, with a plurality of memory chips (8 chips, for example) as one unit. As shown in FIG. 7, a plurality of chips (e.g. 8 chips) of SDRAMs are placed on a module substrate 58, and signals input to respective SDRAMs are controlled by a memory controller 60. Respective signals supplied from memory controller 60 are input to input/output terminals 65 and input terminals 66 of respective chips 62 to 64, through input/output data pins 68, 69, and 73, control signal . address signal input pin 70, and clock signal input pins 71 and 72. Specifically, a control signal CT such as chip select signal /CS, row address strobe signal /RAS and column address strobe signal /CAS as well as address signal Add. are supplied from memory controller 60 to control signal address signal input pin 70 as a common input to all of the chips 62 to 64, then distributed to respective chips 62 to 64 at module substrate 68. On the other hand, since external clock signal ext.CLK is important in the system, it is supplied as two clock signals CLKA and CLKB from memory controller 60 to respective clock signal input pins 71 and 72, and distributed to respective chips 62 to 64 at module substrate 58. Usually one external clock signal is allocated to 2 to 4 chips. In FIG. 7, clock signals CLKA and CLKB are respectively allocated to four chips. Therefore, clock signals CLKA and CLKB have larger driving power than other signals.

Figure 8:
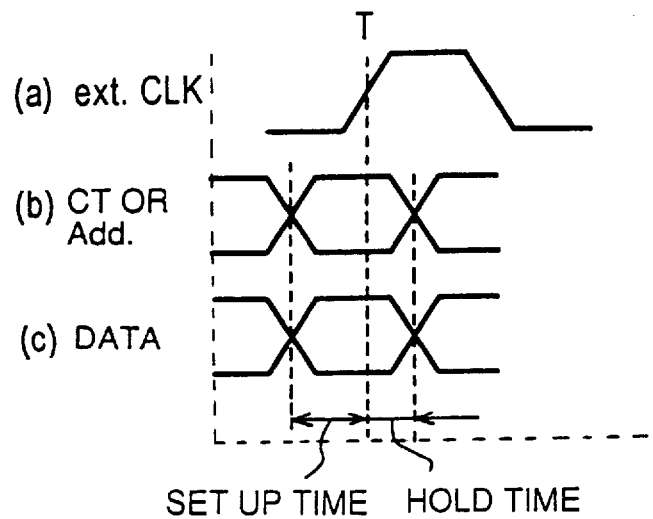
FIG. 8 shows one example of the timing of the signals supplied to DIMM shown in FIG. 7.
Figure 9:
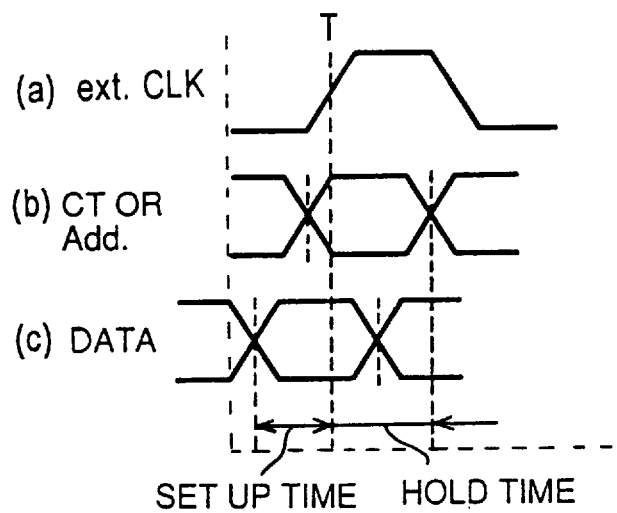
FIG. 9 shows the input timing of signals to SDRAM which were input to DIMM at the timing shown in FIG. 8.
Figure 10:
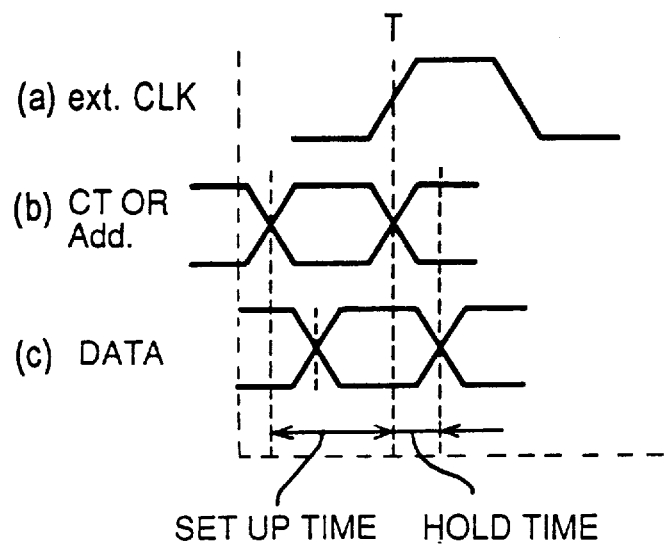
FIG. 10 shows another example of the input timing of the signals to DIMM in FIG. 7.
Figure 11:
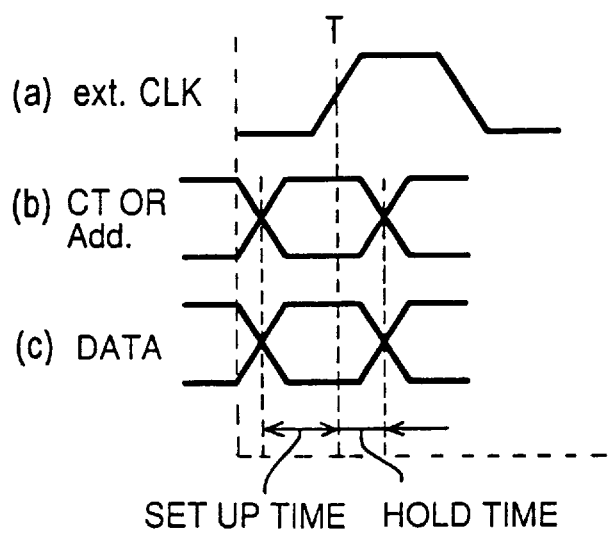
FIG. 11 shows the input timing of signals to SDRAM which were supplied to DIMM at the timing shown in FIG. 10.

On the other hand, the data to be input are supplied from memory controller 60 to respective input/output terminals 65 provided for respective chips 62 to 64. In this case, the difference in load capacitance and interconnection resistance causes skew between control signal CT or address signal Add. and input data. As a result, the set up time of an input signal could be longer, or desired data could not be written. FIGS. 8 to 11 are timing charts showing the skew of input signals on the module. FIGS. 8 and 10 show the timing of the input to input/output data pins 68, 69, and 73, to control signal address signal input pin 70, and to clock signal input pins 71 and 72 on module substrate 58, and FIGS. 9 and 11 show the timing of the input to input/output terminal 65 or input terminal 66 provided for each of chips 62 to 64 located on module substrate 58.

Because of large load capacitance and interconnection resistance of control signal CT and address signal Add. in this module, when respective signals are input to input/output data pins 68, 69 and 73, to control signal address signal input pin 70, and to clock signal input pins 71 and 72 at the timing shown in FIG. 8, they are supplied to input/output terminal 65 or input terminal 66 of each of chips 62 to 64 at the timing shown in FIG. 9. If DIMM is constituted by eight chips, load capacitance on control signal CT and address signal Add. becomes eight times as large as that of a single SDRAM, and interconnection delay also increases as shown in FIG. 9 because of the longer interconnections on module substrate 58. As for external clock signal ext.CLK, load capacitance becomes four times as large as that of a single SDRAM and the interconnections on module substrate 58 would become slightly longer in DIMM constituted by eight chips according to this embodiment. However, the delay time is negligible compared to the delay time caused by the interconnection capacitance and interconnection resistance of other signals, since the external clock signal has sufficiently large driving power.

As for the data to be input, they are supplied from input/output data pins 68, 69 and 73 located at the lower part of the module adjacent to respective chips 62 to 64 to respective input/output terminals 65, so that the load capacitance is the same as that of a single SDRAM, the interconnections on module substrate 58 are short, and the delay time of the signal is also short.

At each of chips 62 to 64, therefore, skew among input signals occurs. More specifically, as shown in FIGS. 8 and 9, control signal CT and address signal Add. having longer delay are input to each of chips 62 to 64 later than external clock signal ext.CLK and the input data. The skew among input signals in each of chips 62 to 64 increases, and a desired command or address cannot be identified, resulting in malfunction. In order to eliminate the skew among input signals in respective chips 62 to 64 as shown in FIG. 11, the timing of signals input to DIMM should be as shown in FIG. 10 considering the delay. The set up time for the input to chips 62 to 64 of DIMM is determined by control signal CT or address signal Add. shown at (b) of FIG. 10, and the hold time is determined by the timing of the data shown at (c) of FIG. 10. The width of the window of set up time/hold time for the input to DIMM increases, then the high speed operation of SDRAM is hindered.

A synchronous semiconductor memory device shown in FIG. 12 is accordingly advantageous. In the synchronous semiconductor memory device shown in FIG. 12, delay in external clock signal ext.CLK and input data is small, so that the data to be input is accurately latched at input latch circuit 8 by internal clock signal int.CLK generated from external clock signal ext.CLK through clock buffer 4. However, control signal CT and address signal Add. have larger delay when they are latched at input latch circuit 8 due to load capacitance and interconnection resistance on module substrate 58, and there occurs skew among the input data and themselves. According to the present invention, delay circuits 74 and 79 are respectively connected between clock buffer 4 and input latch circuit 8 and between buffer 78 and input latch circuit 8, in order to adjust the delay in external clock signal ext.CLK and input data to be the same as the delay in control signal CT and address signal Add.

Figure 13:
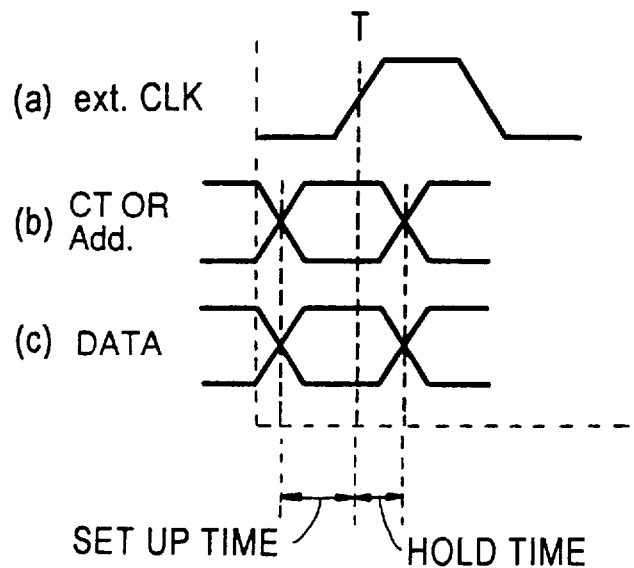
FIG. 13 shows the timing of signals supplied to DIMM shown in FIG. 7.
Figure 14:
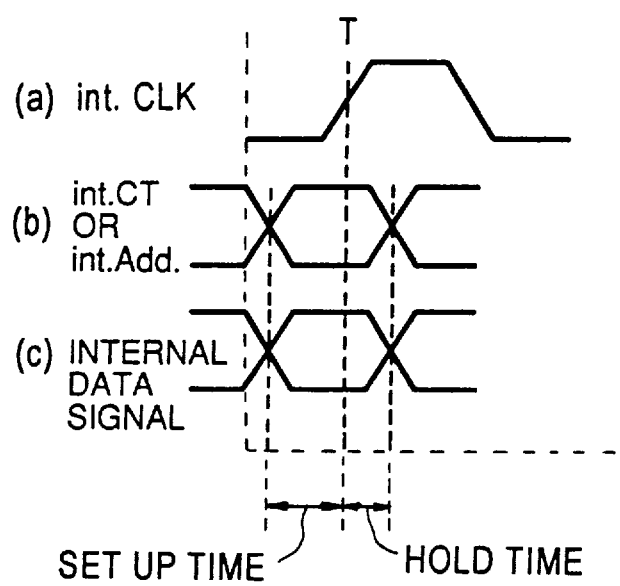
FIG. 14 is a timing chart showing the operation of SDRAM in FIG. 12 when signals are supplied to DIMM at the timing shown in FIG. 13.
Figure 15:
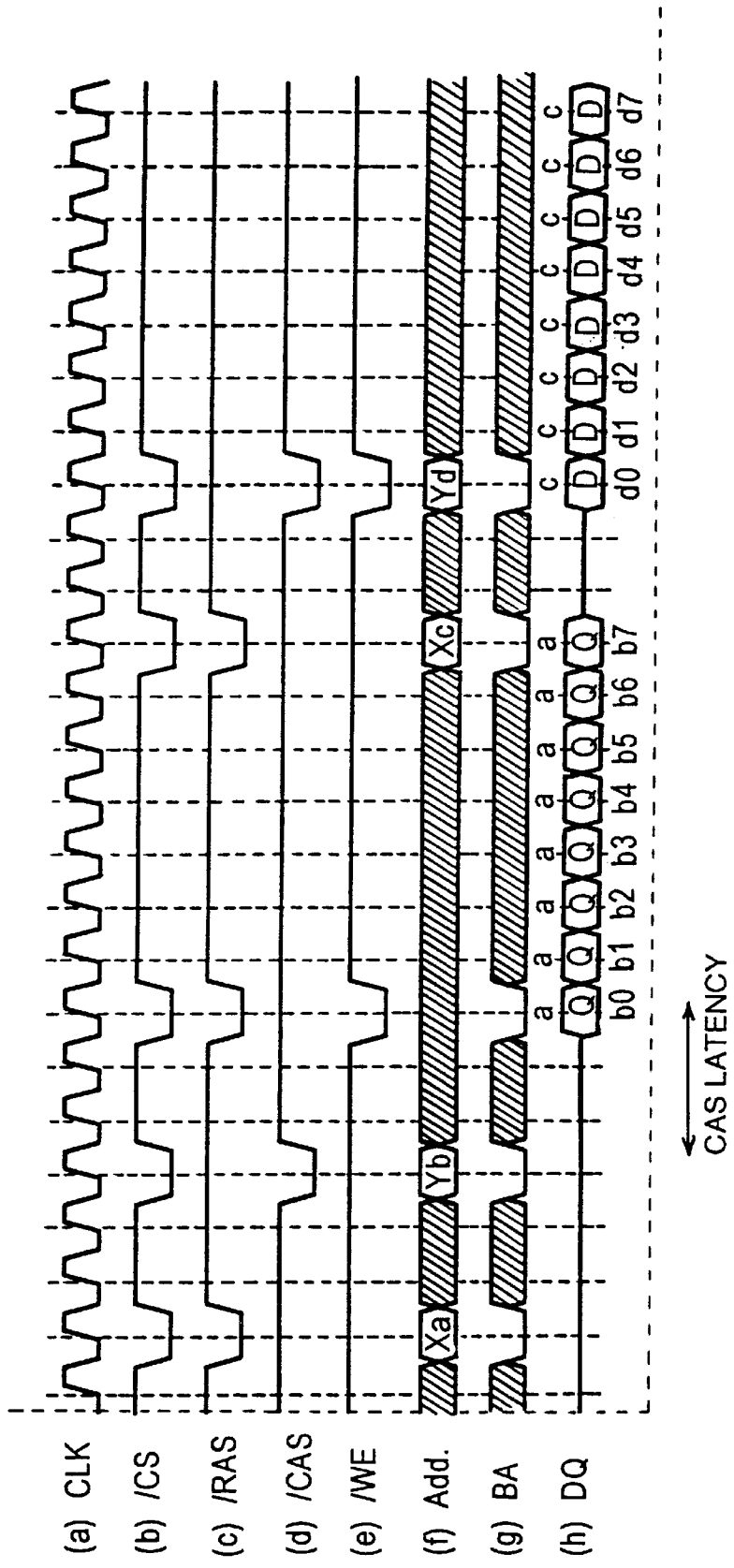
FIG. 15 is a timing chart showing an ordinally operation of SDRAM.
Figure 16:
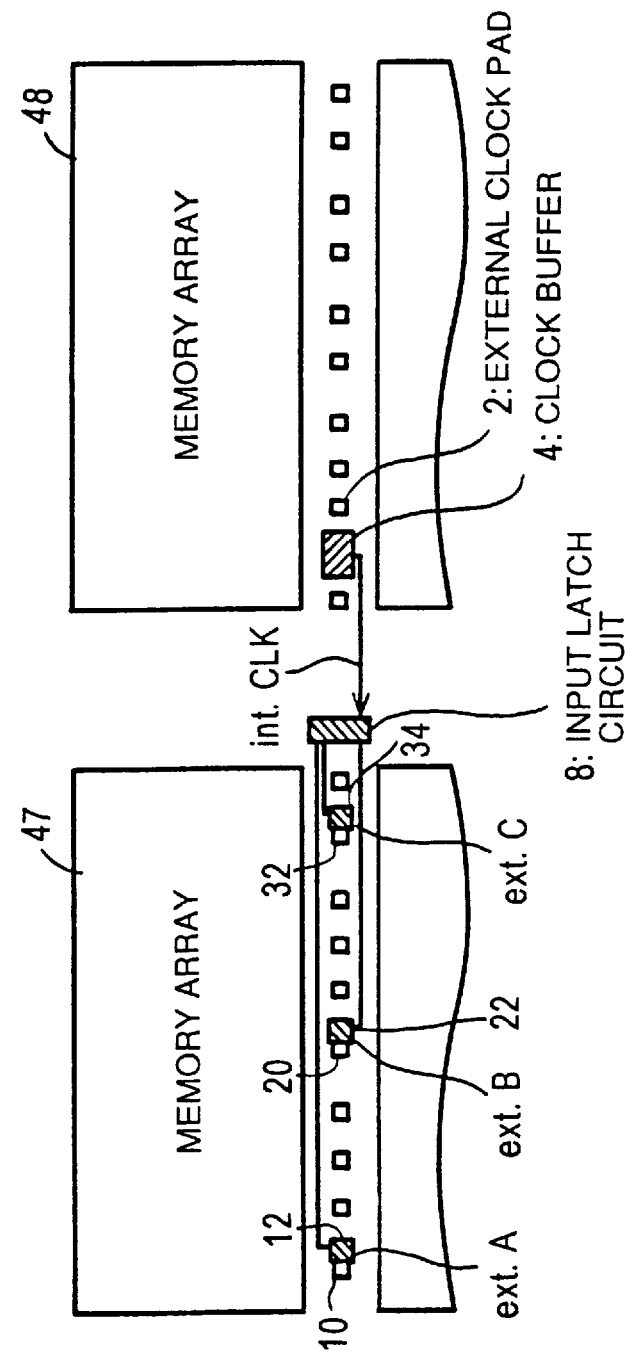
FIG. 16 is a layout of a conventional SDRAM.
Figure 17:
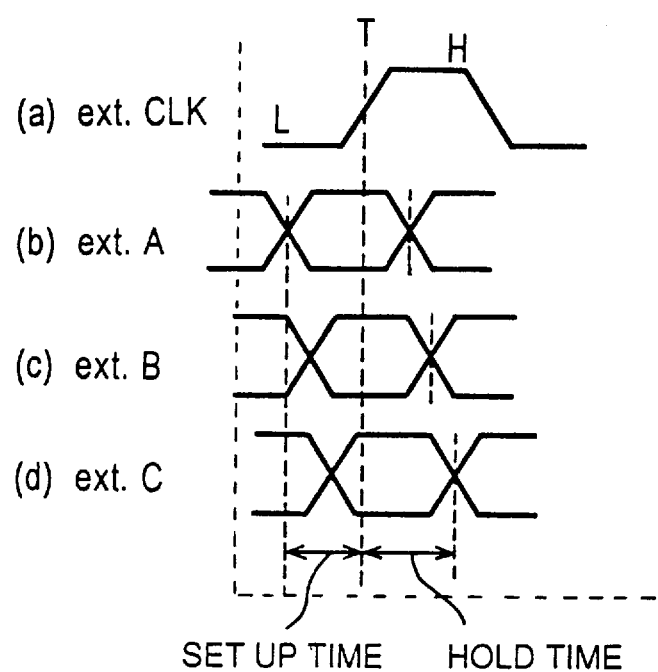
FIG. 17 is a timing chart showing the skew of signals input to SDRAM shown in FIG. 16.

The delay in external clock signal ext.CLK and input data is thus increased, so that the delay time becomes the same as that in address signal Add. and control signal CT. Each signal input to DIMM at the timing shown in FIG. 13 is latched in input latch circuit 8 at the timing shown in FIG. 14.

In the synchronous semiconductor memory device according to the third embodiment, the width of the window of set up time/hold time can be decreased by eliminating skew among input signals in respective chips 62 to 64, so that SDRAM can accurately operate at high speed as described in the first and the second embodiments even if it is used as a module.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device operating in synchronization with a clock signal, comprising:

latch means responsive to said clock signal for latching internal signals;

a plurality of input buffering means connected to said latch means, for buffering supplied external signals and for generating said internal signals, respectively; and delay means connected between at least one of said plurality of input buffering means and said latch means, for delaying the internal signal generated by said at least one input buffering means, wherein a time period when said internal signal is transmitted from said at least one input buffering means to said latch means is the same as a time period when the other of said internal signals is transmitted from the other of said input buffering means to said latch means.

2. A synchronous semiconductor memory device operating in synchronization with an external clock signal, comprising:

internal clock signal generating means responsive to said external clock signal for generating an internal clock signal;

a plurality of output buffers connected to said internal clock signal generating means responsive to said internal clock signal for outputting data, respectively;

delay means connected between at least one of said plurality of output buffers and said internal clock signal generating means for delaying said internal clock signal to be supplied to said at least one output buffer such that said internal clock signal generated in said internal clock signal generating means is simultaneously transmitted to said plurality of output buffers.

3. A synchronous semiconductor memory device operating in synchronization with an external clock signal, comprising:

clock buffering means for buffering said external clock signal and for generating an internal clock signal;

input buffering means for buffering an externally supplied control signal or address signal and for generating an internal control signal or an internal address signal;

data buffering means for buffering externally supplied data;

latch means responsive to said internal clock signal for latching the data buffered by said data buffering means and one of said internal control signal and said internal address signal; and delay means connected between said data buffering means and said latch means for delaying the data buffered by said buffering means, wherein a time period when said data is transmitted from said data buffering means to said latch means is the same as a time period when said internal control signal or said internal address signal is transmitted from said input buffering means to said latch means.

4. The synchronous semiconductor memory device according to claim 3, wherein the synchronous semiconductor memory device is used as a memory module arranged on a module substrate, said synchronous semiconductor memory device further comprising:

an input/output terminal connected to an input/output data pin on said module substrate; and input terminals connected to a control signal input pin or an address signal input pin on said module substrate, larger in number than said input/output terminal.

5. The synchronous semiconductor memory device according to claim 4, wherein said delay means delays the data buffered by said data buffering means for a time period equal to difference between the delay time caused when said control signal or said address signal is transmitted from said control signal input pin or said address signal input pin to one of said input terminals and the delay time caused when said externally supplied data is transmitted from said input/output data pin to said input/output terminal.

* * * * *